United States Patent
Hiramatsu et al.

(10) Patent No.: US 7,414,272 B2
(45) Date of Patent: Aug. 19, 2008

(54) FLUORESCENT SUBSTANCE CONTAINING NITROGEN, METHOD FOR MANUFACTURING THE SAME, AND LIGHT-EMITTING DEVICE

(75) Inventors: Ryosuke Hiramatsu, Kawasaki (JP); Kazuaki Ootsuka, Yokosuka (JP); Naomi Shida, Tokyo (JP); Masaaki Tamatani, Fujisawa (JP); Hisayo Uetake, Yokosuka (JP); Yoshihito Tsutsui, Chigasaki (JP)

(73) Assignees: Kabushiki Kaisha Toshiba, Tokyo (JP); Toshiba Materials Co., Ltd., Yokohama-shi (JP); Toshiba Lighting & Technology Corporation, Tokyo (JP)

( * ) Notice: Subject to any disclaimer, the term of this patent is extended or adjusted under 35 U.S.C. 154(b) by 244 days.

(21) Appl. No.: 11/179,575

(22) Filed: Jul. 13, 2005

(65) Prior Publication Data

US 2006/0011936 A1 Jan. 19, 2006

(30) Foreign Application Priority Data

Jul. 14, 2004 (JP) ............................. 2004-207723

(51) Int. Cl.
H01L 33/00 (2006.01)
(52) U.S. Cl. ......................................... 257/99; 257/100
(58) Field of Classification Search ............ 257/87–103
See application file for complete search history.

(56) References Cited

U.S. PATENT DOCUMENTS

| 6,765,237 | B1 * | 7/2004 | Doxsee et al. | 257/98 |
| 7,229,573 | B2 * | 6/2007 | Setlur et al. | 257/98 |
| 2006/0011936 | A1 | 1/2006 | Hiramatsu et al. | |

FOREIGN PATENT DOCUMENTS

| CN | 1337988 A | 2/2002 |
| EP | 1 104 799 A1 | 6/2001 |
| EP | 1 433 831 | 6/2004 |
| JP | 2003-277746 | 10/2003 |
| WO | 01/39574 | 6/2001 |
| WO | WO 01/40403 A1 | 6/2001 |
| WO | WO 2004/030109 A1 | 4/2004 |

OTHER PUBLICATIONS

U.S. Appl. No. 11/443,095, filed May 31, 2006, Fukuda et al.
J.W.H. van Krevel, "On new rare-earth doped M-Si-Al-O-N materials: Luminescence properties and oxidation resistance", chapter 2 and 3, Jan. 27, 2000, pp. 19-27 and 29-41.

* cited by examiner

*Primary Examiner*—Cuong Q Nguyen
(74) *Attorney, Agent, or Firm*—Oblon, Spivak, McClelland, Maier & Neustadt, P.C.

(57) ABSTRACT

Disclosed is a method for manufacturing a nitrogen-containing fluorescent substance comprising accommodating an oxide fluorescent substance containing two or more elements in a receptacle made of a material containing carbon, and sintering the oxide fluorescent substance in a mixed gas atmosphere containing nitrogen gas.

19 Claims, 3 Drawing Sheets

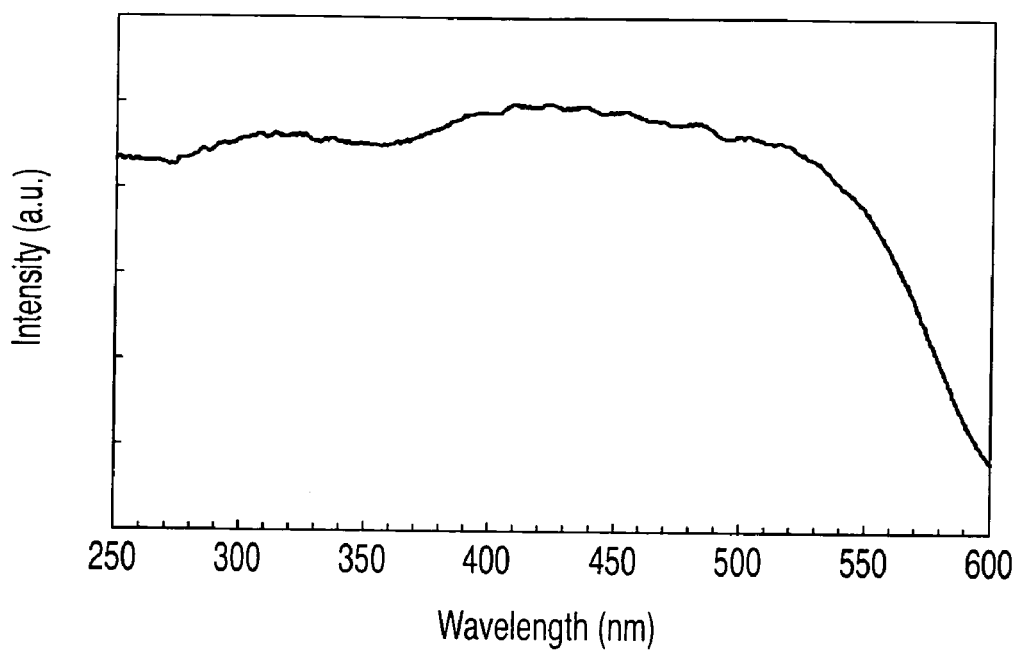
F I G. 6
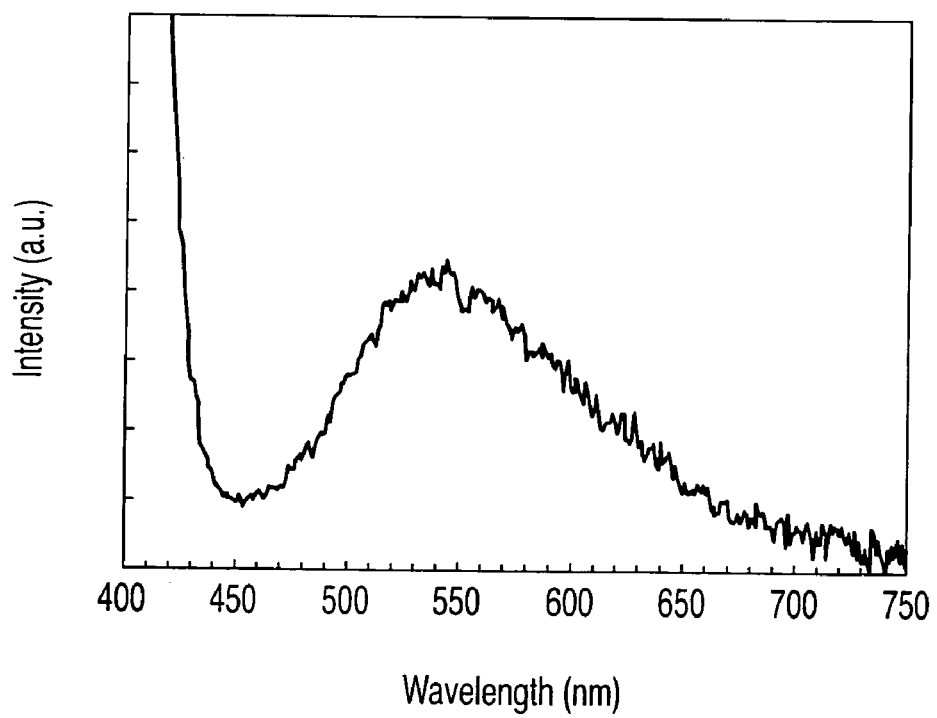
F I G. 7

FLUORESCENT SUBSTANCE CONTAINING NITROGEN, METHOD FOR MANUFACTURING THE SAME, AND LIGHT-EMITTING DEVICE

CROSS-REFERENCE TO RELATED APPLICATIONS

This application is based upon and claims the benefit of priority from prior Japanese Patent Application No. 2004-207723, filed Jul. 14, 2004, the entire contents of which are incorporated herein by reference.

BACKGROUND OF THE INVENTION

1. Field of the Invention

This invention relates to a method for manufacturing a fluorescent substance containing nitrogen, to a fluorescent substance containing nitrogen, and to a light-emitting device employing the fluorescent substance containing nitrogen.

2. Description of the Related Art

Nowadays, there is an increasing trend to employ a white light-emitting diode (white LED) in various fields. The white LED emits white light in such a manner, for example, that several kinds of light to be emitted from several kinds of fluorescent substances each employed for shifting the wavelength of part of light emitted from an LED chip are mixed with the light that has been emitted from an LED chip without the wavelength thereof being shifted at all so as to obtain white light. In the conventional white LED however, since it is difficult to obtain the light of long wavelength side in the visible radiation region, the light emitted from the conventional white LED becomes somewhat yellowish white. Because of this, this white light is insufficient in color tone if it is to be employed as an illumination for display application or for medical application, so that there is a strong demand for an LED which is capable of emitting a somewhat reddish white light.

As for the fluorescent substance which is capable of emitting a reddish light when an ultraviolet or blue light-emitting diode is employed as a light source, there has been proposed a nitride fluorescent substance having a composition represented by $M_xSi_yN_z$:Eu (wherein M is at least one selected from the group consisting of Ca, Sr, Ba and Zn; $Z=(2/3)X+(4/3)Y$; preferably X=2 and Y=5 or X=1 and Y=7). Since this fluorescent substance is capable of absorbing light having a short wavelength ranging from 300 to 550 nm and capable of emitting a light having a long wavelength ranging from 550 to 750 nm, it is possible, through the employment of this fluorescent substance, to emit lights ranging from yellow to red from the light of ultraviolet region while absorbing visible lights of indigo, blue and bluish green.

The aforementioned nitride fluorescent substance can be manufactured in such a manner that a base material of fluorescent substance, and a refined metal or a nitride thereof acting as an activator are mixed together and then subjected to sintering in an ammonia atmosphere using a boron nitride crucible at a temperature ranging from 1200 to 1600° C. In this case, since an apparatus for disposing ammonia employed as an atmospheric gas is required to be installed and moreover, since the process is complicated and a manufacturing apparatus of large scale is required to be employed, the cost for manufacturing the nitride fluorescent substance would become high. Furthermore, if an LED which is capable of emitting white light is to be manufactured by using this nitride fluorescent substance, another fluorescent substance which is capable of emitting yellow light or blue light is required to be employed in combination with this nitride fluorescent substance.

As described above, the conventional nitride fluorescent substance is accompanied with problems that it is difficult to manufacture a fluorescent substance exhibiting useful light-emitting properties and that it is difficult to determine a suitable mixing ratio for the adjustment of white-emitting light.

BRIEF SUMMARY OF THE INVENTION

A method for manufacturing a nitrogen-containing fluorescent substance according to one aspect of the present invention comprises accommodating an oxide fluorescent substance containing two or more metal elements in a receptacle made of a material containing carbon; and sintering the oxide fluorescent substance in a mixed gas atmosphere containing nitrogen gas.

A method for manufacturing a nitrogen-containing fluorescent substance according to another aspect of the present invention comprises sintering an oxide fluorescent substance represented by the following general formula (1) in a mixed gas atmosphere containing nitrogen gas, thereby converting at least part of the oxide fluorescent substance into a nitrogen-containing fluorescent substance represented by the following general formula (2):

$$M_2SiO_4:Z \quad (1)$$

$$M_2Si_5N_8:Z \quad (2)$$

(wherein M is at least selected from the group consisting of Sr, Ba and Ca; and Z is at least of activator selected from the group consisting of Eu and Ce).

A nitrogen-containing fluorescent substance according to one aspect of the present invention comprises which is manufactured by the aforementioned methods.

A light-emitting device according to one aspect of the present invention comprises a light-emitting element having a first emission spectrum; and a fluorescent layer comprising a nitrogen-containing fluorescent substance which is manufactured by the aforementioned methods, the nitrogen-containing fluorescent substance shifting the wavelength of at least part of the first emission spectrum, thereby exhibiting a second emission spectrum formed of at least one emission band and falling within a different wavelength region from that of the first emission spectrum.

BRIEF DESCRIPTION OF THE SEVERAL VIEWS OF THE DRAWING

FIG. 6 is a graph showing an excitation spectrum of the fluorescent substance of Example 7; and FIG. 7 is a graph showing an emission spectrum obtained from the excitation of near-ultraviolet-LED by the fluorescent substance of Example 8.

DETAILED DESCRIPTION OF THE INVENTION

Figure 1:
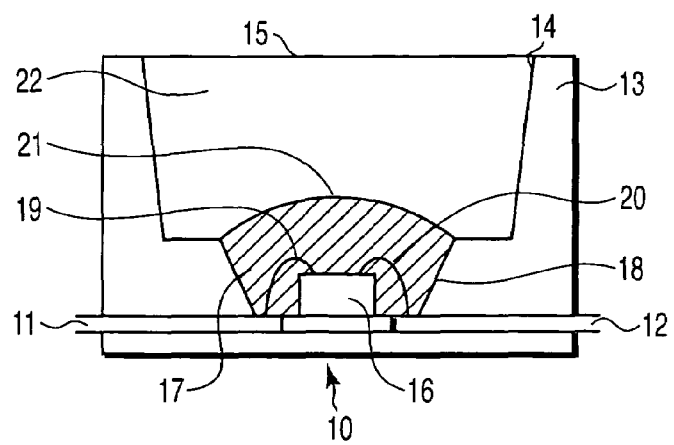
FIG. 1 is a cross-sectional view illustrating the construction of the light-emitting device according to one embodiment of the present invention.

Next, the embodiments of the present invention will be explained.

In the method for manufacturing a fluorescent substance according to one embodiment of the present invention, an oxide fluorescent substance is employed as a raw material. Preferably, the oxide fluorescent substance useful in this case comprises two or more metal elements, exhibiting an emission spectrum falling within a region ranging from blue to orange color. This oxide fluorescent substance has a composition represented by the following general formula (1):

$$M_2SiO_4:Z \qquad (1)$$

(wherein M is at least one selected from the group consisting of Sr, Ba and Ca; and Z is at least one activator selected from the group consisting of Eu and Ce).

A nitride fluorescent substance can be obtained by the reduction/nitrification of the aforementioned oxide fluorescent substance, the nitride fluorescent substance thus manufactured being enabled to emit light from the entire body thereof. It is possible, through the control of nitrification of the oxide fluorescent substance employed as a raw material, to obtain a mixed fluorescent substance comprising of a nitride fluorescent substance and a raw oxide fluorescent substance, thus making it possible to manufacture a mixed fluorescent substance comprising an optional ratio of a nitride fluorescent substance and a raw oxide fluorescent substance, which is suitable for coating on a near-ultraviolet or blue light-emitting diode. The composition ratio ((the weight of a nitride fluorescent substance)/(the weight of an oxide fluorescent substance)) in the mixed fluorescent substance can be varied by changing, for example, the sintering atmosphere (the concentration of hydrogen, etc.) and the sintering conditions (such as temperature and time). For example, when the concentration of hydrogen in the atmosphere is increased, the aforementioned composition ratio would become higher. Further, when the sintering temperature is made higher or when the sintering time is made longer, the aforementioned composition ratio can be increased.

Alternatively, it is also possible to control the aforementioned composition ratio in the mixed fluorescent substance by treatments after sintering. More specifically, by dipping a fluorescent substance in an aqueous solution of a strong acid such as hydrochloric acid, nitric acid, sulfuric acid, etc. subsequent to the aforementioned sintering, it is possible to vary the aforementioned composition ratio. For example, when the concentration of the aforementioned acids is increased to pH=1 or when the dipping time is prolonged by about one hour, the weight of the oxide fluorescent substance can be decreased, thus increasing the aforementioned composition ratio in the mixed fluorescent substance.

In this specification, the term "nitrogen-containing fluorescent substance" is intended to include not only a nitride fluorescent substance but also a mixed fluorescent substance comprising a nitride fluorescent substance and a raw oxide fluorescent substance.

The oxide fluorescent substance to be employed as a raw material should preferably be a high luminance oxide fluorescent substance where the light-emitting characteristics thereof are adjusted in advance. Because, in the case where a mixed fluorescent substance is to be manufactured through the reduction/nitrification of part of an oxide fluorescent substance of high luminance, the high luminance thereof would maintained, thus making the resultant mixed fluorescent substance also high in luminance.

The oxide fluorescent substance can be synthesized according to any conventional method. For example, a raw material powder constituting the M component in the above formula (1), $SiO_2$ powder and $Eu_2O_3$ powder are mixed together at first. As for the raw material powder constituting the M component, it is possible to employ $SrCO_3$, $BaCO_3$, $CaCO_3$, etc. Although there is not any particular limitation with respect to the average particle diameter of these powders, it is preferable to confine the average particle diameter of these powders within the range of 0.1 to 10 μm in order to enable the solid reaction of these powders to proceed uniformly and sufficiently. The mixture thus obtained is then subjected to sintering in a reducing nitrogen/hydrogen atmosphere at a temperature ranging from 1000 to 1400° C. In this case, the sintering may be performed by using a sintering assistant such as ammonium chloride, etc. After-finishing the sintering, the oxide fluorescent substance is pulverized by ball mill and then washed with water. Thereafter, the pulverized particles are sieved to obtain the oxide fluorescent substance having particle diameters ranging from 5 to 20 μm, which is then allowed to dry by drying oven. By going through these steps, an oxide fluorescent substance to be employed as a starting material can be obtained. However, an oxide fluorescent substance which is available in the market may be employed.

The oxide fluorescent substance is accommodated in a receptacle for performing the sintering of the oxide fluorescent substance. Herein, with respect to the features of the receptacle, there is no particular limitation as long as it is capable of accommodating the oxide fluorescent substance and hence it is possible to employ, apart from a so-called crucible, receptacles of various configurations such as a plate-like configuration, a rod-like configuration, etc.

Since a receptacle made of a carbon-containing material does not obstruct the reaction system, it is possible to obtain a fluorescent substance which is high in purity and excellent in emission characteristics. Specific examples of such a receptacle include those formed of carbon or silicon carbide (SiC). The receptacle may be also formed of a mixture of carbon and silicon carbide. It has been confirmed, as a result of studies made by the present inventors, that alumina ($Al_2O_3$), boron nitride (BN) and quartz are unsuitable for use as a material for the receptacle to be employed herein due to the following reasons. Namely, alumina ($Al_2O_3$) is unsuitable since it obstructs the nitriding reaction or the reaction system, boron nitride (BN) is unsuitable for use as a material for the receptacle to be employed is not suited for use since it will be decomposed in a nitrogen/hydrogen atmosphere, and quartz is not suited for use since a receptacle made of quartz would melt at the sintering temperature. It is now possible, through the employment of a receptacle made of carbon or silicon carbide, to reduce and nitrize an oxide fluorescent substance, thereby obtaining a desirable nitride fluorescent substance.

The receptacle having an oxide fluorescent substance positioned therein is subjected to sintering in a reducing mixed gas atmosphere containing nitrogen gas. This reducing mixed gas atmosphere containing nitrogen gas can be prepared by using a mixture comprising hydrogen gas and nitrogen gas. The mixing ratio between hydrogen gas and nitrogen gas ($H_2:N_2$) may be about 10:90-70:30 (volume ratio). If the content of hydrogen gas is lower than this lower limit, the reduction of the oxide would become insufficient. On the other hand, if the content of nitrogen gas is lower than this lower limit, it may become impossible to obtain a desired quantity of nitrogen-containing fluorescent substance.

The reduction/nitrification of the oxide fluorescent substance can be achieved by sintering the oxide fluorescent substance at a temperature of, for example, 1600° C. or more. In this sintering, it is possible to employ a tube furnace, a compact furnace or a high-frequency furnace. The sintering temperature should preferably be confined within the range of 1600 to 1700° C. Preferably, the sintering should be performed in a single sintering step wherein the sintering is performed for 2 to 10 hours at a temperature of 1600° C. or more. However, the sintering may be performed in a two-step sintering wherein the first sintering step is performed for 1 to 3 hours at a temperature ranging from 800 to 1400° C. and the second sintering step is performed for 1 to 9 hours at a temperature of 1600° C. or more.

By going through the aforementioned process, a fluorescent substance containing nitrogen can be obtained. This nitrogen-containing fluorescent substance is formed of a composition represented, in accordance with the kind of raw material of oxide fluorescent substance, by $M_2Si_5N_8:Z$ (wherein M is at least one selected from the group consisting of Sr, Ba and Ca; and Z is at least one activator selected from the group consisting of Eu and Ce). Since this fluorescent substance is excellent in crystallinity and is formed of highly transparent particles, this fluorescent substance is enabled to exhibit excellent properties such as high luminance, high energy efficiency and high quantum efficiency.

The product thus obtained may contain, apart from the elements contained in $M_2Si_5N_8:Z$, residual impurities which were originally included in the raw materials. Examples of such residual impurities include Co, Mo, Ni, Cu and Fe. Since these impurities would become a cause for the deterioration of emission luminance or a cause for obstructing the activity of the activator, these impurities should be removed out of the system as far as possible. These impurities can be eliminated by any suitable measures such as the employment of high purity raw material (oxide fluorescent substance) or the employment of clean experimental equipment.

If Eu is employed as an activator for the fluorescent substance having a composition represented by $M_2Si_5N_8:Z$, the fluorescent substance is enabled to absorb a first emission spectrum falling within a wavelength region of near-ultraviolet (NUV) ranging approximately from 370 to 410 nm or a wavelength region of blue ranging approximately from 420 to 470 nm. On the other hand, if Ce is employed as an activator for the fluorescent substance, the fluorescent substance is enabled to absorb a first emission spectrum falling within a wavelength region of NUV ranging approximately from 370 to 430 nm. Irrespective of the kind of element (Eu or Ce) to be employed, the concentration of Z should preferably be confined within the range of: $Z/(M+Z)=0.03-0.13$ (in molar ratio). When Z is included in the composition at a concentration falling within this range, it is possible to obtain a nitrogen-containing fluorescent substance of high luminance which is capable of exhibiting an emission spectrum ranging from yellow to red. This nitrogen-containing fluorescent substance is also excellent in temperature characteristics and hence is capable of exhibiting excellent emission characteristics throughout a wide range of service temperature of LEDs, i.e. ranging from $-30°$ C. to $200°$ C.

It is now possible, through the employment of the method according to this embodiment of the present invention, to easily manufacture a nitrogen-containing fluorescent substance at a high yield. While the raw oxide fluorescent substances are capable of exhibiting green, yellow or orange light emission, the nitride fluorescent substances thus obtained through the reduction/nitrification of oxide fluorescent substance are all enabled to exhibit red, orange or yellow light emission. Therefore, this nitrogen-containing fluorescent substance is advantageous in the respect that it can be coated on a light-emitting diode immediately after the manufacture of this nitrogen-containing fluorescent substance when manufacturing a light-emitting device without necessitating the mixing of the nitride fluorescent substance with another fluorescent substance which is capable of exhibiting a predetermined color of emission.

In order to enhance the moisture resistance of the particles of fluorescent substance thus obtained, the particles may provide with a specific kind of surface material on a surface. For example, it is possible to employ, as such a surface material, at least one selected from the group consisting of silicone resin, epoxy resin, fluororesin, tetraethoxy silane (TEOS), silica, zinc silicate (for example, $ZnO.cSiO_2 (1 \leq c \leq 4)$), aluminum silicate (for example, $Al_2O_3.dSiO_2 (1 \leq d \leq 10)$), calcium polyphosphate, silicone oil and silicone grease. The surface of the particles may not be completely covered with such a surface material but may be partially exposed. Namely, as long as a surface material containing any of the aforementioned materials is existed on the surface of particles of fluorescent substance, the effects of moisture resistance can be obtained.

The surface material can be deposited on the surface of particles of fluorescent substance by using a dispersion or solution of the surface material. Specifically, the surface material can be deposited on the surface of particles of fluorescent substance in such a manner that the particles of fluorescent substance are dipped in a dispersion or solution of the surface material for a predetermined period of time and then allowed to dry by heating, for instance, thereby depositing the surface material on the surface of particles of the fluorescent substance. The surface material should preferably be deposited on the surface of particles of the fluorescent substance at about 0.1-5% based on the volume of the particles of the fluorescent substance.

FIG. 1 shows a cross-sectional view of the light-emitting device according to one embodiment of the present invention.

In the light-emitting device shown in FIG. 1, the resin stem 10 thereof comprises lead wires 11 and 12 formed from a lead frame, and a resin portion 13 which is formed integral with the lead frame. The resin portion 13 is provided with a first recess 15 having an upper opening which is made larger in area than the bottom thereof. A light reflection surface 14 is formed on the sidewall of this recess 15.

A second recess 17 is formed at a central portion of the circular bottom surface of the first recess 15. A light-emitting chip 16 is mounted at a central portion of the bottom of the second recess 17 by using an Ag paste, etc. As for the light-emitting chip 16, it is possible to employ one which is capable of ultraviolet light emission or one which is capable of emitting light of the visible radiation region. The electrodes (not shown) of the light-emitting chip 16 are electrically connected, via bonding wires 19 and 20 made of Au, etc., with the lead wire 11 and the lead wire 12, respectively. The arrangement of these lead wires 11 and 12 may be variously altered. Incidentally, the reference number 18 denotes a light reflection surface, the reference number 21 denotes a fluorescent substance-containing resin, and the reference number 22 denotes a sealing body.

Inside the second recess 17 formed in the resin portion 13, there is disposed a fluorescent substance layer (a fluorescent substance-containing resin) 21. This fluorescent substance layer 21 can be formed by dispersing the fluorescent substance of one embodiment of the present invention in a resin layer formed of a silicone resin for example at a ratio ranging from 5 to 50 wt %.

As for the light-emitting chip 16, it is also possible to employ a chip of a flip-chip type where the n-type electrode and p-type electrode are both formed on the same surface. In this case, since the provision of lead wires is no longer required, it is possible to obviate the problems such as the cut-off or peeling of lead wire, or the problems originating from the provision of lead wires, such as the light absorption by the lead wire, thereby making it possible to obtain a semiconductor light-emitting device which is excellent in reliability and in luminance. Further, by using an n-type substrate for the fabrication of the light-emitting chip 16, the following structure can be fabricated. More specifically, an n-type electrode is formed on the rear surface of the n-type substrate and a p-type electrode is formed on the top surface of the semiconductor layer on the substrate. Then, leads are mounted so as to connect them with the n-type electrode and the p-type electrode, respectively. The n-type electrode and the p-type electrode are connected respectively with the other lead by using wires.

As for the size of the light-emitting chip 16 and the size and configuration of the first recess 15 and the second recess 17, they can be optionally modified as long as the fluorescent substance is enabled to effectively emit light. The fluorescent substance according to one embodiment of the present invention is capable of emitting a bluish green-reddish light through the excitation thereof using a light having a wavelength ranging from 360 nm to 550 nm. When the fluorescent substance according to one embodiment of the present invention is employed in combination with a blue-emitting fluorescent substance and a red-emitting fluorescent substance, it is also possible to obtain a white light.

The fluorescent substance layer made of the fluorescent substance according to one embodiment of the present invention can be employed in combination with a semiconductor light-emitting element having a first emission spectrum for the manufacture of a light-emitting device. This fluorescent substance is capable of shifting the wavelength of at least part or all of the first emission spectrum to create a second emission spectrum formed of at least one emission band and falling within a different wavelength region from that of the first emission spectrum. Therefore, it is possible to obtain a light-emitting device which is capable of emitting light of various colors apart from blue, green, yellow and red. As one example of the nitrogen-containing fluorescent substance according to one embodiment of the present invention, it is possible to employ an alkaline earth metal-based nitrogen-containing silicide fluorescent substance. This fluorescent substance corresponds to those that can be represented by the aforementioned general formula (1) wherein M is Si, Ba or Ca and Z is Eu or Ce, and is capable of absorbing light of a short wavelength falling within an ultraviolet-blue region, i.e. a wavelength ranging from 250 to 550 nm and capable of emitting light of a long wavelength falling within an orange-red region, i.e. a wavelength ranging from 580 to 780 nm.

As explained above, according to the embodiment of the present invention, it is possible to easily synthesize a nitrogen-containing fluorescent substance which is excellent in emission characteristics and to manufacture, through the employment of this nitrogen-containing fluorescent substance, a light-emitting device which is excellent in stability and capable of constantly emitting excellent white light.

Next, the present invention will be further explained in detail with reference to specific examples.

First of all, by using $SrCO_3$ powder (2.4 μm in average particle diameter) as a raw material for the M component, $BaCO_3$ powder (2.6 μm in average particle diameter) as another raw material for the M component, $SiO_2$ powder (0.9 μm in average particle diameter), and $Eu_2O_3$ powder (1.1 μm in average particle diameter) as a raw material for the activator Z, an oxide fluorescent substance was synthesized. Incidentally, these $SrCO_3$, $BaCO_3$, $Eu_2O_3$ and $SiO_2$ powders were mixed together at a molar ratio of: 1.84:0.12:0.04:1.00, respectively. The mixture thus obtained was placed in an alumina crucible and sintered in a reducing nitrogen/hydrogen mixed gas atmosphere for 3-7 hours at a temperature ranging from 1000 to 1400° C. The product obtained from this sintering step was examined by using an X-ray powder diffraction apparatus, thus confirming it as having a composition of: $(Sr,Ba)_2SiO_4$:Eu.

The $(Sr,Ba)_2SiO_4$:Eu fluorescent substance thus obtained was subjected to pulverization, washing with water, sieving and drying to obtain a raw material (oxide fluorescent substance) for the nitrogen-containing fluorescent substance.

The oxide fluorescent substance thus pulverized was placed in a carbon crucible and sintered at a temperature of 1630° C. in a reducing mixed gas atmosphere formed through the supply of hydrogen gas and nitrogen gas at a volume ratio of: 1:1. After continuing the sintering for 8 hours, the product was examined by a fluorescence microscope, the product was confirmed as formed of a mixed fluorescent substance containing $(Sr,Ba)_2Si_5N_8$:Eu and $(Sr,Ba)_2SiO_4$:Eu, the volume ratio thereof being 90:10. This fluorescent substance will be hereinafter referred to as Example 1.

Further, in addition to the aforementioned $SrCO_3$ powder, $BaCO_3$ powder and $CaCO_3$ powder were also prepared as raw materials for the M component. In addition to the aforementioned $Eu_2O_3$ powder, $Ce_2O_3$ powder was also prepared as a raw material for the activator Z. By variously changing the composition of these raw materials as well as the sintering conditions as shown in the following Table 1, the synthesis of the fluorescent substances of Examples 2-10 was performed according to the method representing one embodiment of the present invention.

TABLE 1

| | | Sintering conditions | | | | Composition |
|---|---|---|---|---|---|---|
| No. | Compositions of raw materials | Temp. (° C.) | Time (h) | Atmosphere $H_2/N_2$ | Crucible | ratio of product* |
| 1 | $(Sr,Ba)_2SiO_4$:Eu | 1630 | 8 | 1:1 | Carbon | 90/10 |
| 2 | $(Sr,Ba)_2SiO_4$:Eu | 1630 | 3 | 1:3 | Carbon | 10/90 |
| 3 | $(Sr,Ba)_2SiO_4$:Eu | 1630 | 2.5 | 1:1 | Carbon | 50/50 |
| 4 | $(Sr,Ba)_2SiO_4$:Eu | 1630 | 3 | 1:1 | Carbon | 60/40 |
| 5 | $(Sr,Ba)_2SiO_4$:Eu | 1630 | 10 | 1:1 | SiC | 70/30 |

TABLE 1-continued

| No. | Compositions of raw materials | Sintering conditions | | | | Composition ratio of product* |
|---|---|---|---|---|---|---|
| | | Temp. (° C.) | Time (h) | Atmosphere $H_2/N_2$ | Crucible | |
| 6 | $(Ba,Ca)_2SiO_4$:Eu | 1650 | 2.5 | 1:3 | Carbon | 25/75 |
| 7 | $(Sr,Ba)_2SiO_4$:Eu | 1630 | 10 | 1:1 | Carbon | 100/0 |
| 8 | $(Sr,Ba)_2SiO_4$:Ce | 1600 | 3 | 1:1 | Carbon | 10/90 |
| 9 | $Sr_2SiO_4$:Ce | 1600 | 3 | 1:1 | Carbon | 10/90 |
| 10 | $Ba_2SiO_4$:Ce | 1600 | 3 | 1:1 | Carbon | 30/70 |

*(weight of nitride fluorescent substance)/(weight of oxide fluorescent substance)

Figure 2:
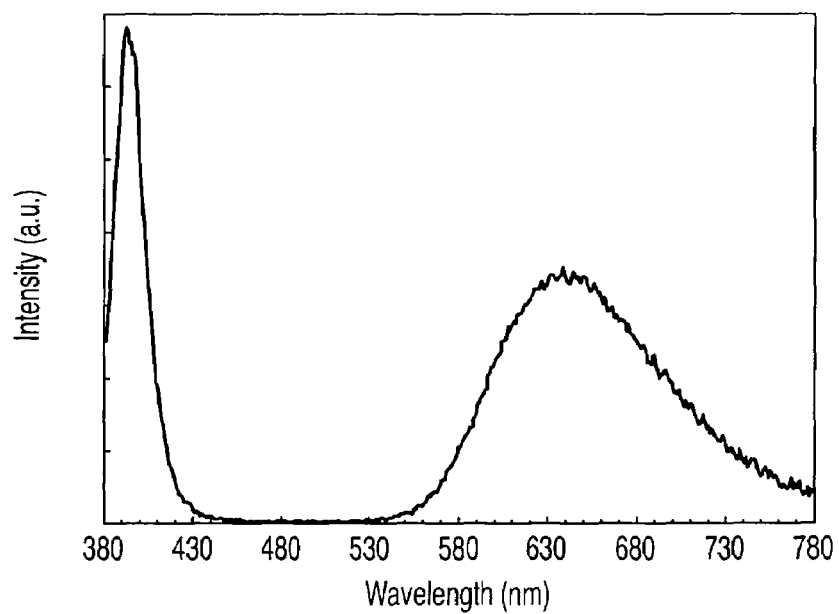
FIG. 2 is a graph showing an emission spectrum obtained from the excitation of near-ultraviolet-LED by the fluorescent substance of Example 3
Figure 3:
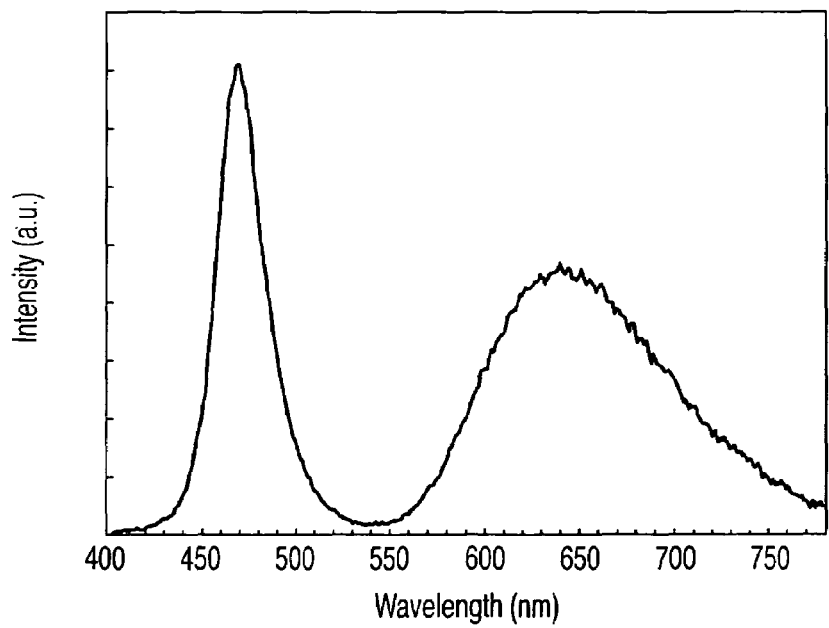
FIG. 3 is a graph showing an emission spectrum obtained from the excitation of blue-LED by the fluorescent substance of Example 3.

FIG. 2 shows an emission spectrum obtained from the excitation of near-ultraviolet-LED by the fluorescent substance of Example 3, and FIG. 3 shows an emission spectrum obtained from the excitation of a blue-LED by the fluorescent substance of Example 3. In FIG. 2, a region in the vicinity of 380-430 nm corresponds to the first emission spectrum. The fluorescent substance of Example 3 was excited by a light having a wavelength of approximately 380-430 nm and was enabled to emit a light of approximately 550-780 nm (the second emission spectrum). In FIG. 3, a region in the vicinity of 440-520 nm corresponds to the first emission spectrum. The fluorescent substance of Example 3 was excited by light having a wavelength of approximately 440-520 nm and was enabled to emit light of approximately 560-780 nm (the second emission spectrum).

Figure 4:
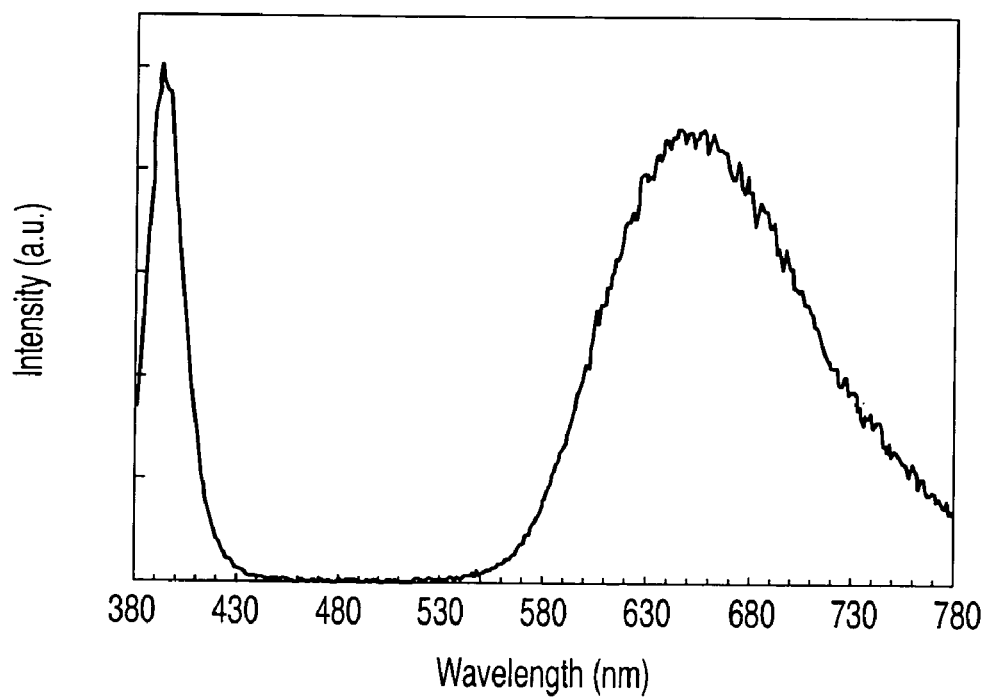
FIG. 4 is a graph showing an emission spectrum obtained from the excitation of near-ultraviolet-LED by the fluorescent substance of Example 7.
Figure 5:
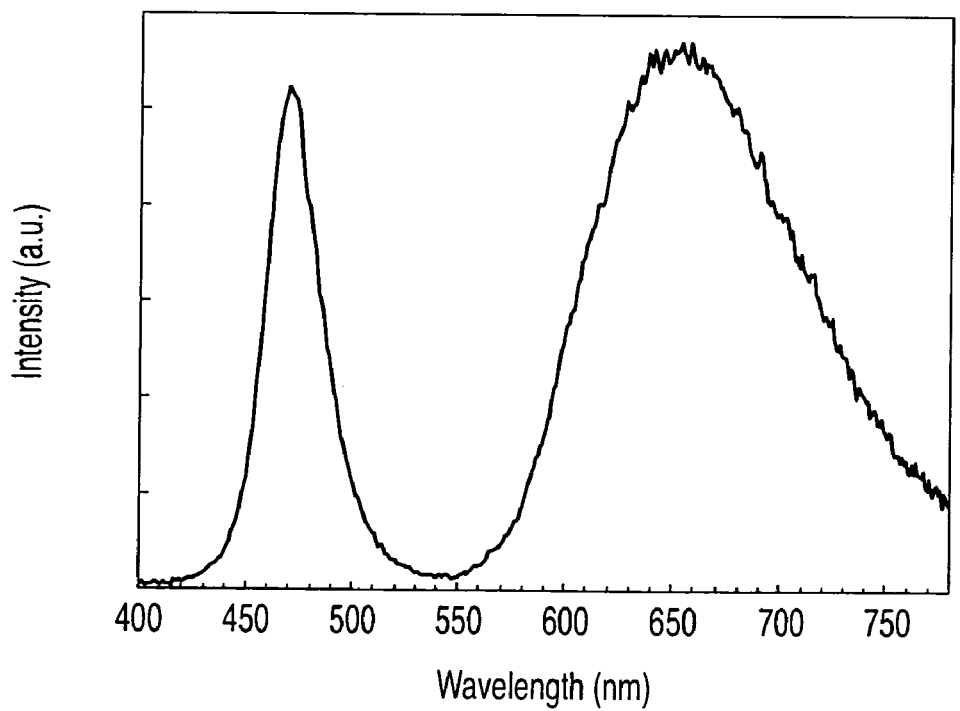
FIG. 5 is a graph showing an emission spectrum obtained from the excitation of blue-LED by the fluorescent substance of Example 7.

Further, FIG. 4 shows an emission spectrum obtained from the excitation of near-ultraviolet-LED by the fluorescent substance of Example 7, and FIG. 5 shows an emission spectrum obtained from the excitation of blue-LED by the fluorescent substance of Example 7. In FIG. 4, a region in the vicinity of 380-430 nm corresponds to the first emission spectrum. The fluorescent substance of Example 7 was excited by light having a wavelength of approximately 380-430 nm and was enabled to emit a light of approximately 570-780 nm (the second emission spectrum). In FIG. 5, a region in the vicinity of 440-520 nm corresponds to the first emission spectrum. The fluorescent substance of Example 7 was excited by light having a wavelength of approximately 440-520 nm and was enabled to emit light of approximately 570-780 nm (the second emission spectrum). FIG. 6 shows an excitation spectrum of the fluorescent substance of Example 7. It will be seen from FIG. 6 that the fluorescent substance of Example 7 was capable of being excited by the first emission spectrum including not only an emission spectrum of the near-ultraviolet-LED (i.e. in the vicinity of 380-430 nm) but also an emission spectrum of the blue-LED (i.e. in the vicinity of 440-520 nm).

FIG. 7 shows an emission spectrum obtained from the excitation of near-ultraviolet-LED by the fluorescent substance of Example 8, indicating that the fluorescent substance of Example 8 was excited by light having a wavelength of approximately 380-430 nm and was enabled to emit light of approximately 470-700 nm (the second emission spectrum).

Generally, if a white LED is to be manufactured by using a near-ultraviolet (NUV) LED, a blue fluorescent substance, a yellow (green) fluorescent substance and a red fluorescent substance are mixed together at a predetermined ratio and dispersed in a resin to obtain a dispersion which is then deposited, as a fluorescent substance layer, on an NUV-LED chip, thereby manufacturing the white LED. On the other hand, if a white LED is to be manufactured by using a blue-LED, a yellow (green) fluorescent substance and a red fluorescent substance are mixed together at a predetermined ratio and then deposited likewise, as a fluorescent substance layer, on a blue-LED chip, thereby manufacturing the white LED.

As explained above, when the sintering conditions are optimized, it is possible, through the employment of the method representing one embodiment of the present invention, to obtain a mixed fluorescent substance comprising an oxide fluorescent substance and a nitride fluorescent substance. If a blue-LED is to be employed, since these fluorescent substances to be used comprising a yellow (green) fluorescent substance and a red fluorescent substance, the mixed fluorescent substance is mixed with a resin and coated, as it is, on the blue-LED chip to manufacture a white LED. If an NUV-LED is to be employed, only a blue fluorescent substance is mixed with the mixed fluorescent substance.

When the sintering conditions are optimized, it is possible, through the employment of the fluorescent substance representing one embodiment of the present invention, to form a fluorescent substance layer by using a dispersion of only the fluorescent substance in a resin without necessitating the process of mixing it with other fluorescent substances which are capable of emitting different colors. Therefore, the present invention is advantageous in the respect that the manufacturing process of a white LED can be simplified.

According to the embodiment of the present invention, it is possible to provide a method for effectively manufacturing a fluorescent substance which is capable of exhibiting useful white light-emitting characteristics. Further, according to the embodiment of the present invention, it is possible to provide a fluorescent substance whose color tone can be easily adjusted in combination with a light-emitting diode in the manufacture of a white light-emitting device. Furthermore, according to the embodiment of the present invention, it is possible to provide a light-emitting device which is capable of emitting white light which is quite suitable as an illumination for display application or for medical application.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a nitrogen-containing fluorescent substance comprising:
    accommodating an oxide fluorescent substance comprising two or more metal elements in a receptacle made of a material comprising carbon; and
    sintering the oxide fluorescent substance accommodated in the receptacle made of a material comprising carbon in a mixed gas atmosphere comprising nitrogen gas to produce a nitrogen-containing fluorescent substance.

2. The method according to claim 1, wherein the receptacle comprises silicon carbide.

3. The method according to claim 1, wherein the mixed gas atmosphere is a reducing mixed gas atmosphere.

4. The method according to claim 1, wherein the mixed gas atmosphere further comprises hydrogen gas.

5. The method according to claim 4, wherein the mixing ratio of the hydrogen gas to the nitrogen gas ($H_2:N_2$) is 10:90-70:30.

6. The method according to claim 1, wherein the oxide fluorescent substance has a composition represented by the following general formula (1):

$$M_2SiO_4:Z \qquad (1)$$

(wherein M is at least one selected from the group consisting of Sr, Ba and Ca; and Z is at least one activator selected from the group consisting of Eu and Ce).

7. The method according to claim 1, wherein the nitrogen-containing fluorescent substance has a composition represented by the following general formula (2):

$$M_2Si_5N_8:Z \qquad (2)$$

(wherein M is at least one selected from the group consisting of Sr, Ba and Ca; and Z is at least one activator selected from the group consisting of Eu and Ce).

8. The method according to claim 1, wherein the sintering is performed for 2 to 10 hours at a temperature of 1600° C. or more.

9. The method according to claim 1, wherein the sintering is performed at first for 1 to 3 hours at a temperature ranging from 800° C. to 1400° C. and then for 1 to 9 hours at a temperature of 1600° C. or more.

10. The method according to claim 1, wherein the receptacle material comprises silicon carbide and carbon.

11. The method according to claim 1, wherein the receptacle material consists of silicon carbide.

12. The method according to claim 1, wherein the receptacle material consists of carbon.

13. A method for manufacturing a nitrogen-containing fluorescent substance comprising:

sintering an oxide fluorescent substance represented by the following general formula (1) in a mixed gas atmosphere containing nitrogen gas, thereby converting at least part of the oxide fluorescent substance into a nitrogen-containing fluorescent substance represented by the following general formula (2):

$$M_2SiO_4:Z \qquad (1)$$

$$M_2Si_5N_8:Z \qquad (2)$$

(wherein M is at least one selected from the group consisting of Sr, Ba and Ca; and Z is at least one activator selected from the group consisting of Eu and Ce).

14. The method according to claim 13, further comprising accommodating the oxide fluorescent substance in a receptacle made of a material containing carbon before sintering the oxide fluorescent substance.

15. The method according to claim 14, wherein the receptacle comprises silicon carbide or carbon.

16. The method according to claim 13, wherein the mixed gas atmosphere is a reducing mixed gas atmosphere.

17. The method according to claim 13, wherein the mixed gas atmosphere is an atmosphere containing hydrogen gas.

18. The method according to claim 17, wherein the mixing ratio of the hydrogen gas to the nitrogen gas ($H_2:N_2$) is 10:90-70:30.

19. The method according to claim 13, wherein the sintering is performed for 2 to 10 hours at a temperature of 1600° C. or more.

* * * * *